(12) United States Patent
Nuijten et al.

(10) Patent No.: US 7,728,659 B2
(45) Date of Patent: Jun. 1, 2010

(54) ARRANGEMENT FOR AMPLIFYING A PWM INPUT SIGNAL

(75) Inventors: Petrus A. C. M. Nuijten, Eindhoven (NL); Lutsen L. A. H. Dooper, Brummen (NL)

(73) Assignee: NXP B.V., Eindhoven (NL)

( * ) Notice: Subject to any disclaimer, the term of this patent is extended or adjusted under 35 U.S.C. 154(b) by 82 days.

(21) Appl. No.: 11/815,101

(22) PCT Filed: Jan. 20, 2006

(86) PCT No.: PCT/IB2006/050227
§ 371 (c)(1),
(2), (4) Date: Jul. 11, 2008

(87) PCT Pub. No.: WO2006/079960

PCT Pub. Date: Aug. 3, 2006

(65) Prior Publication Data
US 2008/0315945 A1    Dec. 25, 2008

(30) Foreign Application Priority Data
Jan. 28, 2005   (EP)   ................... 05100590

(51) Int. Cl.
*H03F 3/38* (2006.01)
(52) U.S. Cl. ....................................................... 330/10
(58) Field of Classification Search .................. 330/10; 332/109; 375/238
See application file for complete search history.

(56) References Cited

U.S. PATENT DOCUMENTS

| | | | |
|---|---|---|---|
| 4,600,891 A | 7/1986 | Taylor, Jr. et al. | |
| 5,815,581 A | 9/1998 | Andersson | |
| 6,107,875 A | 8/2000 | Pullen et al. | |
| 6,404,280 B1 | 6/2002 | Jeng | |
| 6,466,087 B2 | 10/2002 | Ruha | |
| 6,504,427 B2 * | 1/2003 | Midya et al. ................. 330/10 |
| 6,768,779 B1 | 7/2004 | Nielsen | |
| 2001/0043152 A1 | 11/2001 | Kishida | |
| 2002/0180518 A1 | 12/2002 | Midya et al. | |
| 2004/0066229 A1 | 4/2004 | Taura et al. | |

FOREIGN PATENT DOCUMENTS

| | | |
|---|---|---|
| EP | 1429454 A1 | 6/2004 |
| WO | WO9844626 A2 | 10/1998 |
| WO | WO9844626 A3 | 10/1998 |
| WO | WO2004049560 A1 | 6/2004 |
| WO | WO2004091096 A1 | 10/2004 |

* cited by examiner

Primary Examiner—Steven J Mottola

(57) ABSTRACT

A pulse-width modulation (PWM) amplifier comprises a feedback loop for reshaping the pulses of the PWM input signal to correct timing and amplitude errors in the class D output stage of the amplifier by means of an error correction signal. In such an amplifier the feedback loop gives a substantial amount of base-band noise when the pulse-period of the PWM input signal is not constant, which is especially the case when the PWM signal originates from a noise shaper. The invention reduces this noise by modifying the reshaping gain of the amplifier with a pulse-period proportional signal.

15 Claims, 3 Drawing Sheets

ARRANGEMENT FOR AMPLIFYING A PWM INPUT SIGNAL

Figure 1:
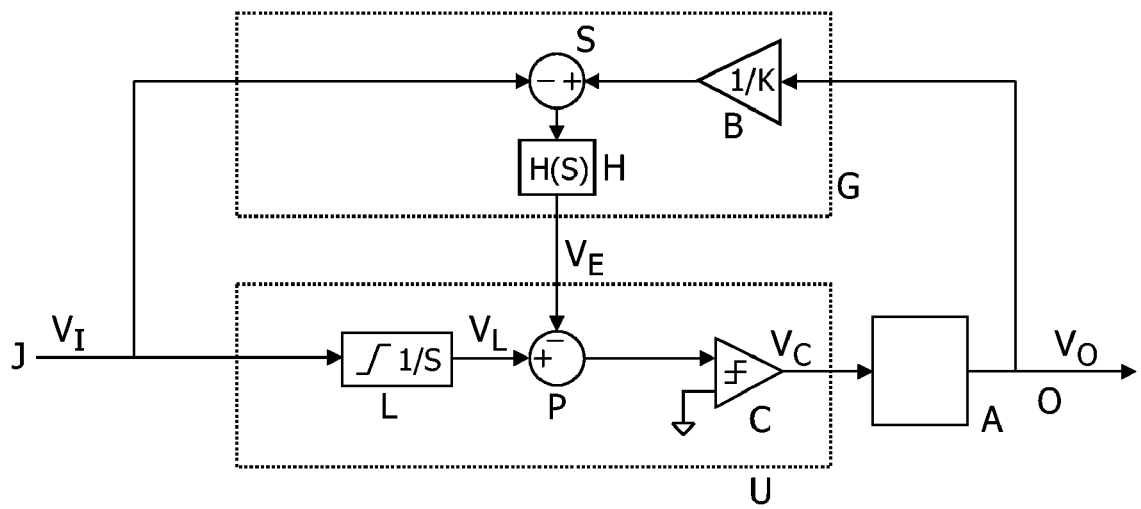

The invention relates to an arrangement for amplifying a pulse-width modulated (PWM) input signal.

Such arrangement is known from the international patent application publication WO98/44626. In the above-mentioned patent application the error correction signal controls the reshaping means in which the edges of the PWM input signal are shifted to compensate for the amplitude and timing errors that occur in the class D output stage. To this end the prior art arrangement uses a limited integrator to create sloping edges on the incoming pulses. Subsequently the sloping edges are compared with the low pass filtered error correction signal and this comparison creates the square pulses with shifted edges for application to the input of the class D amplifier.

It has been found that, if such arrangement uses a PWM input signal that is produced by a PWM noise shaper, the arrangement adds a substantial amount of noise to the base band spectrum of the amplified signal.

It is inter alia an object of the present invention to reduce or substantially suppress the above mentioned base band added noise In this application the term "reshaping gain" means the gain of the open loop between the output of the error correction generator and the input of the class D output stage.

The invention is based on the recognition that, in case the PWM input signal originates from a PWM noise shaper, or in case the PWM input signal is generated in a self oscillating class D amplifying arrangement, the pulse-period of the PWM signal, i.e. the sum of the width of a positive pulse and the width of the consecutive negative pulse, is not constant. The varying pulse-period of the PWM input signal results in a varying gain of the reshaping means and this varying reshaping gain causes the noise in the base band spectrum.

An advantage of the invention is that a control is introduced so that the reshaping gain becomes substantially independent on the duration of the pulse-period.

As is already disclosed in the above mentioned prior art document, the reshaping gain is proportional to the length of the slope ($\tau$) generated by the limited integrating reshaping means and inversely proportional to the pulse-period ($T_s$) of the PWM input signal. Therefore, in a preferred embodiment according to the invention, said controller makes the length of the slope proportional to the pulse-period of the PWM input signal, with other words it changes the steepness of this slope inversely proportional to the pulse-period proportional signal.

In a another preferred embodiment according to the invention the slope of the limited integrated pulses is kept unchanged. In stead thereof the arrangement comprises a multiplier (M) to multiply the error correction signal, prior to its application to the reshaping means, by said pulse-period proportional signal ($V_P$). In this case a pulse-period proportional factor is added to the original reshaping gain, so that the new reshaping gain is substantially independent of the varying pulse-period.

A preferred embodiment of the present invention includes low pass filtering of the pulse-period dependent signal and to use the so low pass filtered signal for the multiplication with the error correction signal. As a consequence, each edge is corrected by a signal that is dependent on a plurality of previous pulse-periods. Because the successive pulse-periods vary in a random manner, low pass filtering the pulse-period proportional signal is not always the most effective way to reduce the noise and therefore the arrangement according to the invention may preferably be further characterized in that the means to generate the pulse-period proportional signal are implemented so that a single pulse-period proportional signal ($d_{rr}$, $d_{ff}$) that is proportional to the period between two successive corresponding edges of the PWM input signal, is used to correct at least one of the edges of said single pulse-period. Various modifications thereof may be implemented as will be shown in the accompanying FIG. 4.

A convenient way to establish the pulse-period or pulse-width of the PWM input signal is obtained when the PWM input signal is, or is transformed into, a digital PWM input signal each of whose pulse-periods comprise a plurality of samples and that the means to generate the pulse-period proportional signal comprise a period-counter for counting the samples of each pulse-period.

Figure 2:
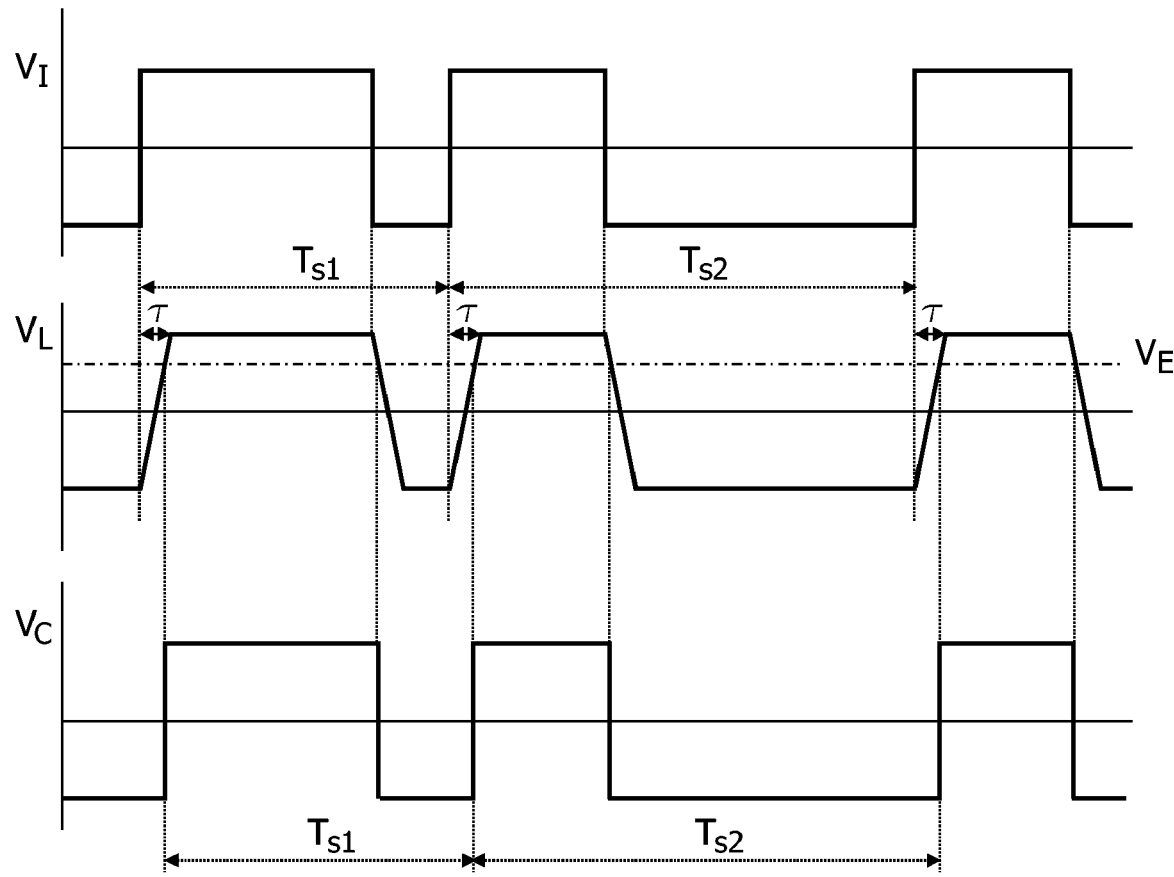
Figure 3:
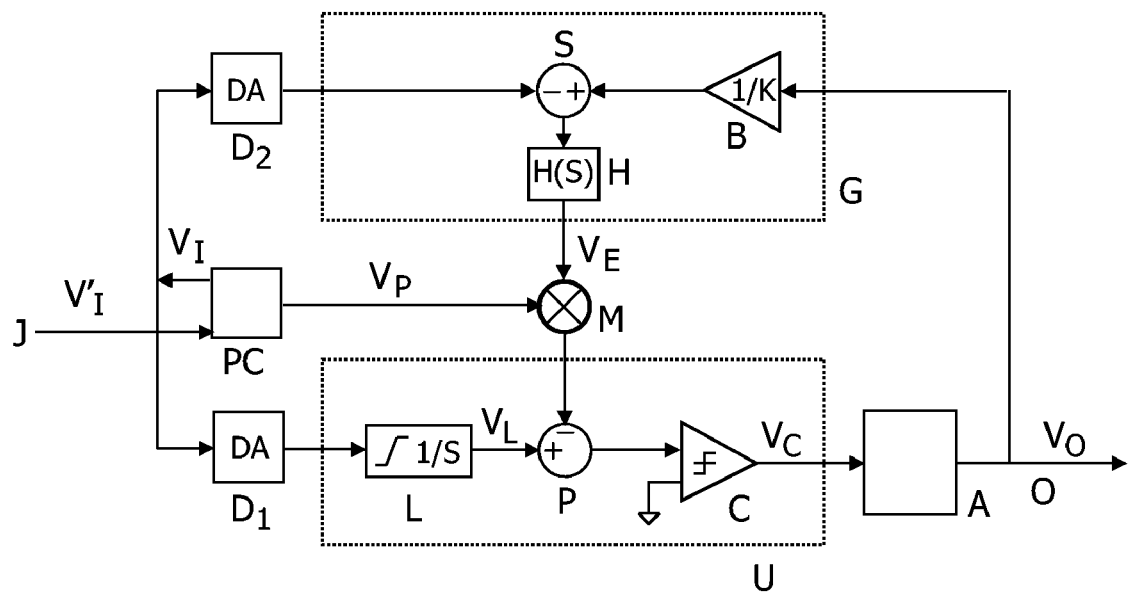
Figure 5:
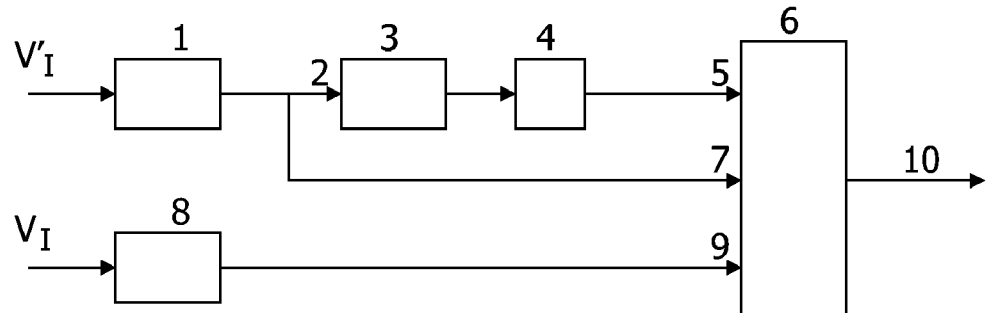
Figure 6:
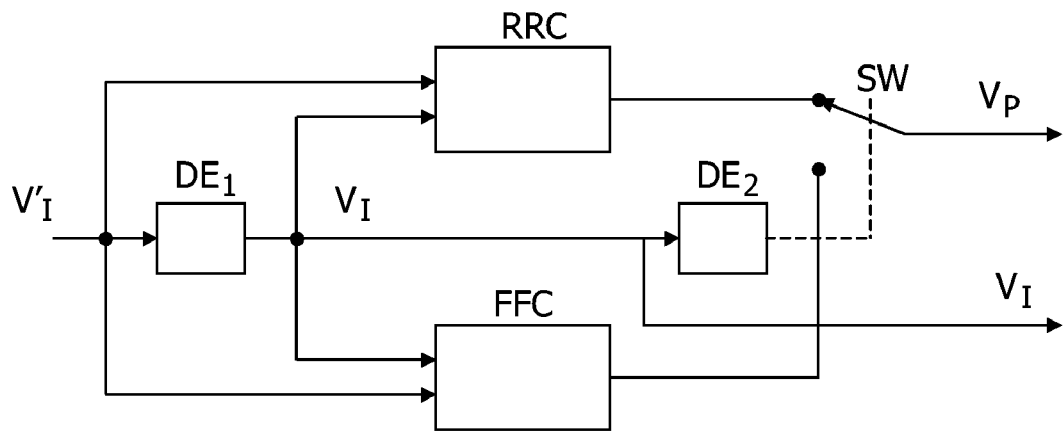
Figure 4A:
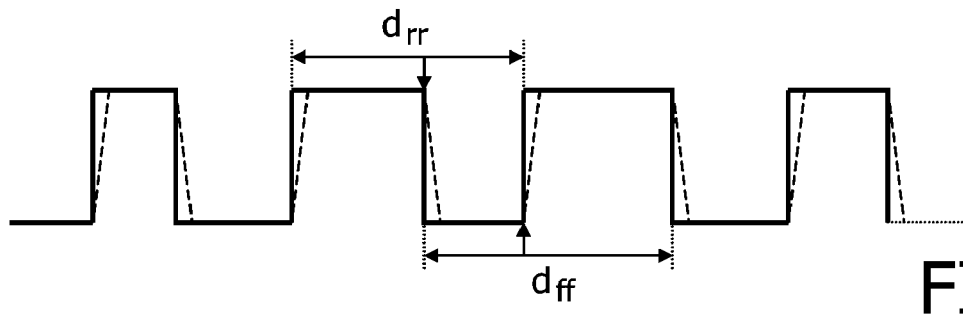

The invention will be described with reference to the accompanying Figures. Herein shows:

FIG. 1 a prior art arrangement for amplifying a PWM input signal,

FIG. 2 waveforms illustrating the operation of the prior art arrangement of FIG. 1, FIG. 3 an arrangement for amplifying a PWM input signal according to the invention, FIG. 4 various operational modes in which an arrangement according to the invention may operate, FIGS. 5 and 6 means to generate a pulse-period proportional signal in accordance with the operational mode of FIG. 4*a*.

The prior art arrangement of FIG. 1 contains an input terminal J to which a PWM input signal $V_I$ is applied. In this example the input signal is an analog PWM signal. This signal is processed in a reshaping unit U in which a correction of the PWM input signal takes place and whose operation will be explained hereafter. The output signal of this unit drives a class D output stage A whose output O may for instance be coupled through a standard class D low pass filter to one or more loudspeakers (not shown). In order to reduce the effects of amplitude- and/or timing errors occurring in this output stage the PWM output signal $V_O$ of the amplifier A is applied to an error correction signal generator G wherein the output signal $V_O$ is firstly attenuated by an attenuator B and subsequently supplied to a subtracter S. In this subtracter the input signal $V_I$ is subtracted from the attenuated output signal $V_O$. The difference between these two PWM signals is filtered in a low pass filter H with transfer function H(s) to generate an error correction signal $V_E$. The attenuator B in the lead between the output O and the subtracter S serves to compensate for the amplification factor K of the amplifier A so that the two PWM-signals in the subtracter S have approximately equal amplitudes.

The reshaping unit U has a limited integrator L to which the PWM input signal is applied and which delivers a limited integrated PWM-signal $V_L$. This signal has less steep edges than the input signal. The slopes of the limited integrated signal $V_L$ start with the edges of the input signal and end a fixed time $\tau$ later. The signals $V_I$ and $V_L$ are illustrated in FIG. 2. In a subtracter P the error signal $V_E$ is subtracted from the limited integrated PWM signal $V_L$ and the difference is applied to the input of a comparator C. The output signal $V_C$ of the comparator is a PWM signal whose edges are shifted with respect to the edges of the input signal $V_I$ to compensate for both the timing errors and the amplitude errors of the output stage A. As is illustrated in FIG. 2 the edges of the signal $V_C$ appear at the instants when the limited integrated PWM signal $V_L$ and the error signal $V_E$ are equal i.e. when the output of the subtracter P is zero.

It has been found that the reshaping means add a substantial amount of noise to the (audio) base band of the signal, when the input signal originates from a PWM noise shaper. While distortion, such as for instance a 1% voltage ripple in the class D output stage A, is largely reduced by the error correction e.g. from −43 dB to a negligible −110 dB, the noise in the higher part of the base band spectrum is increased from −120 dB to −81 dB thereby substantially reducing the dynamic range of the arrangement.

The reason of this added noise is found in the reshaping gain of the arrangement. This reshaping gain may be defined as the effective variation of the reshaped signal with a variation of the error correction signal in an open loop configuration of the arrangement. This reshaping gain ($G_r$) is found to be substantially proportional to $\tau/T_s$, where $\tau$ is the width of the edges of the limited integrated signal $V_L$ and $T_s$ is the pulse-period of the PWM signal (see FIG. 2). When the PWM input signal is obtained from a PWM noise shaper the pulse-period $T_s$, varies with a gaussian distribution. In an audio amplifying arrangement the pulse-period of the signal may e.g. comprise a mean value of 32 samples, but the actual pulse-period may vary between 25 and 39 samples. The gaussian distribution of the pulse-period $T_s$ results in an also gaussian distribution of the reshaping gain $G_r$ and this causes base band spectrum noise to be added to the reshaped PWM signal $V_c$ and consequently to the output signal $V_o$.

In the arrangement of FIG. 3 elements corresponding to those of FIG. 1 have been given the same reference numerals. In this arrangement the error correction signal $V_E$ from the error correction generator G is applied to a multiplier M in which the error correction signal $V_E$ is multiplied by the output signal $V_P$ of a period counter PC. The so multiplied signal $V_E \times V_P$ is applied to the -input of the subtracter P. Now the reshaping gain $G_r$ between the error correction signal $V_E$ and the output signal $V_O$ is not proportional to $\tau/T_s$, as is the case in the prior art arrangement of FIG. 1, but proportional to $V_P \times \tau/T_s$. When the signal $V_P$, which originates from the period counter PC, is proportional to the pulse-period $T_s$, the reshaping gain $G_r$ is constant and the added base band noise is substantially reduced.

The period counter PC receives a (digital) PWM input signal $V'_I$ and delivers a delayed PWM input signal $V_I$ through a first DA-converter $D_1$ to the reshaping unit U and through a second DA-converter $D_2$ to the error correction generator G.

FIG. 4 shows schematically various modes of operation for the arrangement of FIG. 3. The figure shows in normal lines the PWM input signal $V_I$ with varying pulse-period and in broken lines the sloped edges of the limited integrated signal $V_L$. The horizontal arrows $d_{rr}$ denote the pulse-period between two successive rising edges of the PWM input signal and the horizontal arrows $d_{ff}$ denote the pulse-period between two successive falling edges of this input signal.

In the operational mode of FIG. 4a a vertical arrow from the horizontal arrow $d_{rr}$ to the falling edge of the input signal indicates that the pulse-period signal $d_{rr}$, delivered by the pulse-period counter PC is used to correct the falling edge that lies intermediate between the two rising edges of the period of which the signal $d_{rr}$ is calculated. Equally, the vertical arrow from the horizontal arrow $d_{ff}$ to the rising edge of the input signal indicates that the pulse-period signal $d_{ff}$, delivered by the pulse-period counter PC is used to correct the rising edge that lies intermediate between the two falling edges of the period of which the signal $d_{ff}$ is calculated.

Figure 4B:
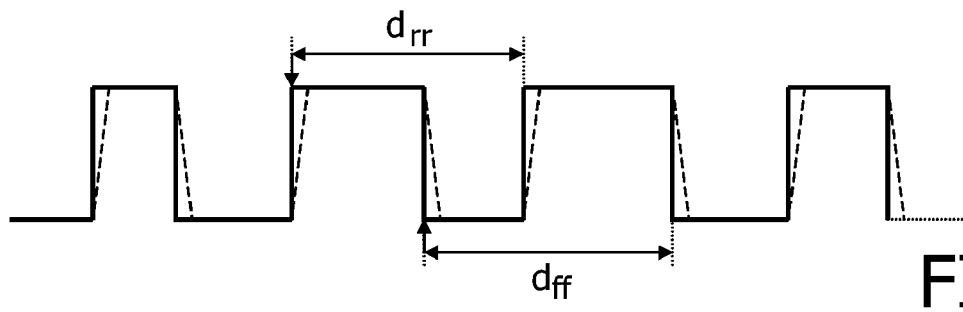

In the operational mode of FIG. 4b the pulse-period signal $d_{ff}$ is used to correct the first of the two falling edges of the corresponding pulse-period and the pulse-period signal $d_{rr}$ is used to correct the first of the two rising edges of the corresponding pulse-period.

Figure 4C:
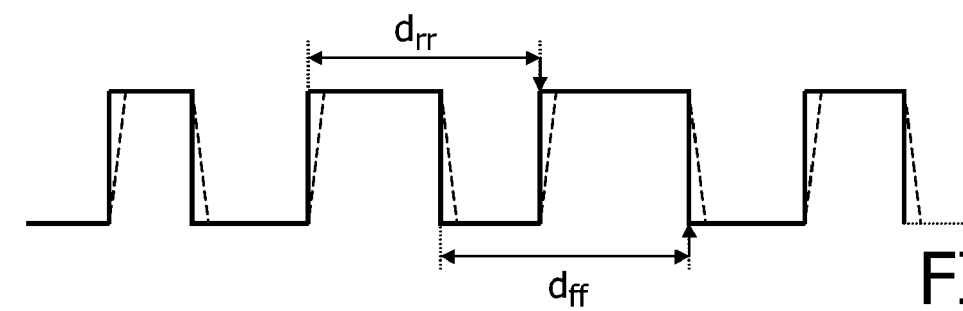

In the operational mode of FIG. 4c the pulse-period signal $d_{ff}$ is used to correct the second of the two falling edges of the corresponding pulse-period and the pulse-period signal $d_{rr}$ is used to correct the second of the two rising edges of the corresponding pulse-period. An advantage of this mode is that less delay-memory is needed for implementing the pulse-period counter PC.

Figure 4D:
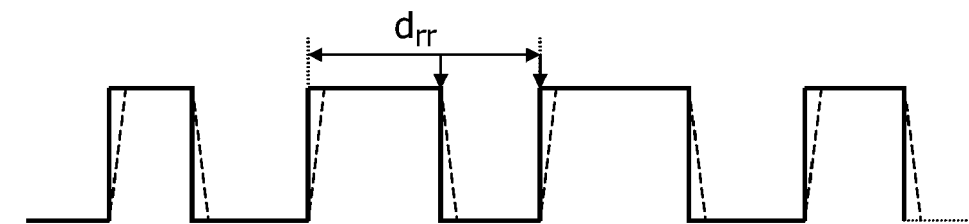

In the operational mode of FIG. 4d the pulse-period signal $d_{rr}$ is used to correct both the falling edge and the second rising edge of the corresponding pulse-period. In this mode the circuitry required to calculate a period signal $d_{ff}$ can be dispensed with, of course at the cost of less accurate noise cancellation. It will be clear that it is also possible to calculate only the pulse-period $d_{ff}$ and to use it to correct one rising edge and one falling edge.

Figure 4E:
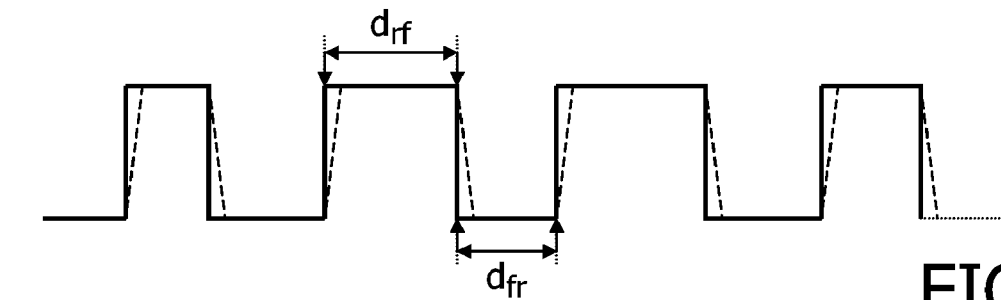

In the operational mode of FIG. 4e the pulse counter PC produces a pulse-width signal $d_{rf}$ representing the time span between a rising edge and the next falling edge as well as a pulse-width signal $d_{fr}$ representing the time span between said falling edge and the next rising edge. The signals $d_{rf}$ and $d_{fr}$ together correct said falling edge while the signal $d_{fr}$ and the next signal $d_{rf}$ together correct the said next rising edge. In one implementation the sum of the two pulse-width signals corrects the said falling edge and the sum of the signal $d_{rf}$ and the next signal $d_{rf}$ corrects said next rising edge. In another implementation each of the signals $d_{rf}$ and $d_{fr}$ corrects the second half of the leading edge of the pulse and the first half of the trailing edge thereof. In this implementation a discontinuity occurs in the middle of each slope of the limited integrated signal applied to the comparator C. It has been found that this implementation gives still less noise than the operational mode of FIG. 4a but at the cost of some non-linear distortion.

The block diagrams of FIGS. 5 and 6 show an implementation of the period counter PC for the operational mode 4a. A person skilled in the art may easily derive there from implementations for any of the other modes of operation.

FIG. 5 shows an implementation of a rising edge to rising edge counter (RR-counter) that counts the samples (clock periods) of a digital PWM signal from a rising edge to the next rising edge. The RR-counter receives the PWM input signal $V'_I$ and a properly delayed version $V_I$ thereof. The signal $V'_I$ is fed to a rising edge detector 1 that may consist of an AND-gate having one input receiving the input signal $V'_I$ directly and a second input receiving a one clock pulse delayed and inverted version of the input signal $V'_I$. The rising edge detector 1 delivers a pulse when a rising edge in the PWM input signal occurs. Falling edges in the signal are ignored.

The output pulse of the rising edge detector 1 is fed to a reset input 2 of a clock pulse counter 3. The output of this counter is fed through a one-clock-pulse delay 4 to an input 5 of a buffer 6. Upon reception of the next rising edge the pulse of the rising edge detector 1 is fed to a pop input 7 of the buffer 6 with the result that the count that is present in the delay 4 is stored in the buffer 6. At the same time the rising edge pulse again resets the counter 2 so that a new count can start.

The properly delayed version $V_I$ of the PWM input signal $V'_I$ is applied to a second rising edge detector 8 that may be identical to the detector 1. When the detector 8 detects a rising edge in the delayed signal $V_I$ the pulse from this detector is applied to a pop-out input 9 of the buffer 6. The result is that the content of the buffer 6 is read out at the buffer output terminal 10, which then delivers the signal $d_{rr}$ representing the rising edge to rising edge pulse-period in terms of its number of clock periods.

While FIG. 5 represents a rising edge to rising edge counter (RR-counter) a falling edge to falling edge counter (FF-counter) may be similar in construction except in that the two rising edge detectors 1 and 8 have to be replaced by falling edge detectors. Such falling edge detector may comprise an AND-gate one input of which receives a one clock-pulse delayed version of the input signal while the other input of the AND-gate receives an inverted version of the input signal.

FIG. 6 shows an implementation of the period counter PC of FIG. 3 for the operational mode of FIG. 4a. This implementation comprises an RR-counter RRC and an FF-counter FFC as described above with reference to FIG. 5. Both units receive the PWM input signal $V'_I$ and, through a delay $DE_1$, the delayed version $V_I$ of the PWM input signal. The delay $DE_1$ has to be larger then the largest possible pulse-period. Moreover each of the buffers 6 in the units RRC and FFC should be able to store a number of counts that is at least equal to the delay $DE_1$ divided by the shortest possible pulse-period. For instance, when in an audio application the largest possible pulse-period is 39 clock periods and the smallest possible pulse-period is 24 clock periods, the delay $DE_1$ should e.g. be 40 clock periods and the two buffers should be able to store at least two counts.

To constitute the output signal $V_P$ of the period counter PC a switch S is provided that switches alternately between the output-signal $d_{rr}$ of the RR-counter and the output-signal $d_{ff}$ of the FF-counter. The switch S is controlled by the delayed PWM input signal $V_I$ through a delay $DE_2$ that delays the switching of the switch S by about the duration τ of the slopes of the limited integrated signal $V_L$ of FIG. 2. The result is that the period counter of FIG. 6 delivers an output signal $V_P$ to the multiplier M of FIG. 3, which is equal to $d_{rr}$ during the major part of the positive pulse of $V_I$ and during the falling slope of $V_L$ and which is equal to $d_{ff}$ during the major part of the negative pulse of $V_I$ and during the rising slope of $V_L$. This ensures that, through the multiplier M, the falling slopes are corrected by the signal $d_{rr}$ and the rising slopes by the signal $d_{ff}$, just as required in the operational mode of FIG. 4a.

The arrangement shown in FIGS. 3, 5 and 6 is designed to receive a digital PWM signal wherein the length of the pulse-period or pulse width is conveniently determined by counting the samples (clock pulses) occurring during said pulse-period or pulse width. It will be apparent that the invention may also be implemented by fully analog means and with an analog PWM input signal. In that case the DA converters D1 and D2 are deleted and, in stead of using a digital period counter PC, an analog pulse-period proportional signal may be obtained e.g. by charging a capacitor with a constant current during the pulse-period and using the voltage obtained across the capacitor at the end of the pulse-period, as the pulse-period proportional signal.

The invention claimed is:

1. Arrangement for amplifying a pulse-width modulated input signal comprising a pulse-width modulation output stage and a feedback loop arranged to reshape the pulse-width modulated signal applied to the pulse-width modulation output stage, characterized by means for generating a pulse period proportional signal from said pulse-width modulation input signal and a controller for controlling said feedback loop therewith;

characterized in that said arrangement comprises an error correction signal generator arranged to compare a pulse-width modulated output signal of the output stage with the pulse-width modulated input signal and to supply an error correction signal resulting from this comparison and limited integrating reshaping means arranged to receive the pulse-width-modulated input signal and the error correction signal and to supply a reshaped pulse-width modulated signal to the input of the output stage; and characterized in that said controller comprises a multiplier to multiply the error correction signal, prior to its application to the reshaping means, by said pulse-period proportional signal.

2. Arrangement as claimed in claim 1, characterized in that the means to generate the pulse-period proportional signal are implemented so that a single pulse-period proportional signal that is proportional to the period between two successive corresponding edges of the pulse-width modulated input signal, is used to correct at least one of the edges of said single pulse-period.

3. Arrangement as claimed in claim 2, characterized in that the single-pulse-period proportional signal is used to correct the intermediary edge of said single pulse-period.

4. Arrangement as claimed in claim 2, characterized in that the single-pulse-period proportional signal is used to correct two successive edges of said single pulse-period.

5. Arrangement as claimed in claim 2, characterized in that the single-pulse-period proportional signal consists of first and second single pulse-width proportional signals, one between a rising edge and the successive falling edge of the pulse-width modulated input signal and one between said falling edge and the successive rising edge of the pulse-width modulated input signal, and that each of the two single pulse-width proportional signals corrects half of both edges of its pulse.

6. Arrangement as claimed in claim 1, characterized in that the pulse-width modulated input signal is a digital pulse-width modulated input signal each of whose pulse-periods comprise a plurality of samples and that the means to generate the pulse-period proportional signal comprise a period-counter for counting the samples of each pulse-period.

7. Arrangement for amplifying a pulse-width modulated input signal comprising a pulse-width modulation output stage and a feedback loop arranged to reshape the pulse-width modulated signal applied to the pulse-width modulation output stage, characterized by means for generating a pulse period proportional signal from said pulse-width modulation input signal and a controller for controlling said feedback loop therewith, characterized in that the means to generate the pulse-period proportional signal are implemented so that a single pulse-period proportional signal that is proportional to the period between two successive corresponding edges of the pulse-width modulated input signal, is used to correct at least one of the edges of said single pulse-period.

8. Arrangement as claimed in claim 7, characterized in that the single-pulse-period proportional signal is used to correct the intermediary edge of said single pulse-period.

9. Arrangement as claimed in claim 7, characterized in that the single-pulse-period proportional signal is used to correct two successive edges of said single pulse-period.

10. Arrangement as claimed in claim 7, characterized in that the single-pulse-period proportional signal consists of first and second single pulse-width proportional signals, one between a rising edge and the successive falling edge of the pulse-width modulated input signal and one between said falling edge and the successive rising edge of the pulse-width modulated input signal, and that each of the two single pulse-width proportional signals corrects half of both edges of its pulse.

11. Arrangement for amplifying a pulse-width modulated input signal comprising a pulse-width modulation output stage and a feedback loop arranged to reshape the pulse-width modulated signal applied to the pulse-width modulation output stage, characterized by means for generating a pulse period proportional signal from said pulse-width modulation input signal and a controller for controlling said feedback loop therewith, characterized in that the pulse-width modulated input signal is a digital pulse-width modulated input signal each of whose pulse-periods comprise a plurality of samples and that the means to generate the pulse-period proportional signal comprise a period-counter for counting the samples of each pulse-period.

12. Arrangement as claimed in claim 11, characterized in that the means to generate the pulse-period proportional signal are implemented so that a single pulse-period proportional signal that is proportional to the period between two successive corresponding edges of the pulse-width modulated input signal, is used to correct at least one of the edges of said single pulse-period.

13. Arrangement as claimed in claim 12, characterized in that the single-pulse-period proportional signal is used to correct the intermediary edge of said single pulse-period.

14. Arrangement as claimed in claim 12, characterized in that the single-pulse-period proportional signal is used to correct two successive edges of said single pulse-period.

15. Arrangement as claimed in claim 12, characterized in that the single-pulse-period proportional signal consists of first and second single pulse-width proportional signals, one between a rising edge and the successive falling edge of the pulse-width modulated input signal and one between said falling edge and the successive rising edge of the pulse-width modulated input signal, and that each of the two single pulse-width proportional signals corrects half of both edges of its pulse.

* * * * *